(12) United States Patent
Liu et al.

(10) Patent No.: US 8,647,991 B1
(45) Date of Patent: Feb. 11, 2014

(54) METHOD FOR FORMING DUAL DAMASCENE OPENING

(75) Inventors: Yu-Heng Liu, Singapore (SG); Seng-Wah Liau, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/561,078

(22) Filed: Jul. 30, 2012

(51) Int. Cl.
*H01L 21/302* (2006.01)
*H01L 21/461* (2006.01)

(52) U.S. Cl.
USPC ............ 438/738; 257/E21.256; 257/E21.257; 257/E21.575; 257/E21.579; 438/637; 438/638; 438/692; 438/706; 438/710

(58) Field of Classification Search
USPC .......... 257/E21.256, E21.257, E21.575, E21, 257/579; 438/637, 638, 692, 706, 710, 738
See application file for complete search history.

(56) References Cited

U.S. PATENT DOCUMENTS

| | | | |
|---|---|---|---|
| 5,314,845 A | 5/1994 | Lee |
| 5,362,526 A | 11/1994 | Wang |
| 5,387,546 A | 2/1995 | Maeda |
| 6,015,759 A | 1/2000 | Khan |
| 6,037,237 A | 3/2000 | Park |
| 6,074,946 A | 6/2000 | Ouellet |
| 6,103,601 A | 8/2000 | Lee |
| 6,153,530 A | 11/2000 | Ye |
| 6,162,587 A | 12/2000 | Yang |
| 6,380,096 B2 | 4/2002 | Hung |
| 6,426,285 B1 | 7/2002 | Chen |
| 6,465,352 B1 | 10/2002 | Aoki |
| 6,573,176 B2 | 6/2003 | Hong |
| 6,605,545 B2 | 8/2003 | Wang |
| 6,638,871 B2 | 10/2003 | Wang |
| 6,649,531 B2 | 11/2003 | Cote |
| 6,696,222 B2 | 2/2004 | Hsue |
| 6,720,132 B2 | 4/2004 | Tsai |
| 6,797,627 B1 | 9/2004 | Shih |
| 6,812,145 B2 | 11/2004 | Ma |
| 6,905,968 B2 | 6/2005 | Hsieh |
| 6,924,228 B2 | 8/2005 | Kim |
| 6,930,048 B1 | 8/2005 | Li |
| 7,067,235 B2 | 6/2006 | Tsai |
| 7,176,126 B2 | 2/2007 | Oh |

(Continued)

OTHER PUBLICATIONS

H. K. Chiu, T. L. Lin, Y. Hu, K. C. Leon, H. C. Lin, M. S. Tsai, and T. Y. Huang, Characterization of titanium nitride etch rate and selectivity to silicon dioxide in a $Cl_2$ helicon-wave plasma, Journal of Vacuum Science & Technology A: Vacuum, Surfaces, and Films, Mar. 2001, p. 455-459, vol. 19, Issue 2, American Vacuum Society, Website.

*Primary Examiner* — Asok K Sarkar
(74) *Attorney, Agent, or Firm* — Ding Yu Tan

(57) ABSTRACT

A method for forming a dual damascene opening includes the following steps. Firstly, a first hard mask layer with a trench pattern is formed over a material layer. Then, a dielectric layer is formed over the first hard mask layer and filled into an opening of the trench pattern. Then, a second hard mask layer with a via opening pattern is formed over the first hard mask layer and the dielectric layer. Then, a first etching process is performed, so that a via opening is at least formed in the dielectric layer. After the second hard mask layer is removed, a second etching process is performed. Consequently, a trench opening is formed in the material layer and the via opening is further extended into the material layer, wherein the via opening is located within the trench opening.

18 Claims, 5 Drawing Sheets

(56) References Cited

U.S. PATENT DOCUMENTS

| | | |
|---|---|---|
| 7,544,623 B2 | 6/2009 | Chou |
| 2002/0182874 A1* | 12/2002 | Wang .......................... 438/706 |
| 2003/0129844 A1 | 7/2003 | Wang |
| 2004/0171256 A1* | 9/2004 | Oladeji et al. ................ 438/689 |
| 2006/0024951 A1 | 2/2006 | Schuehrer |
| 2006/0042651 A1 | 3/2006 | Verhaverbeke |
| 2006/0148243 A1 | 7/2006 | Wang |
| 2006/0252256 A1 | 11/2006 | Weng |
| 2006/0286793 A1 | 12/2006 | Lin |
| 2007/0020565 A1 | 1/2007 | Koh |
| 2007/0052107 A1 | 3/2007 | Weng |
| 2007/0054491 A1 | 3/2007 | Chen |
| 2007/0066047 A1 | 3/2007 | Ye |
| 2007/0077751 A1 | 4/2007 | Chen |
| 2007/0080386 A1 | 4/2007 | Huang |
| 2007/0093053 A1 | 4/2007 | Hsu |
| 2007/0111514 A1 | 5/2007 | Chen |
| 2007/0134917 A1* | 6/2007 | Li et al. ......................... 438/637 |
| 2007/0148598 A1* | 6/2007 | Colburn et al. ............... 430/311 |
| 2007/0184996 A1 | 8/2007 | Weng |
| 2007/0190805 A1 | 8/2007 | Lin |
| 2007/0249165 A1 | 10/2007 | Huang |
| 2008/0113511 A1 | 5/2008 | Park et al. |
| 2008/0121619 A1 | 5/2008 | Lin |
| 2008/0124919 A1 | 5/2008 | Huang |
| 2008/0146036 A1 | 6/2008 | Lai |
| 2008/0171433 A1 | 7/2008 | Huang |
| 2008/0292798 A1 | 11/2008 | Huh |
| 2009/0042053 A1 | 2/2009 | Lin |
| 2009/0142931 A1 | 6/2009 | Wang |
| 2009/0176378 A1 | 7/2009 | Wang |
| 2009/0283310 A1 | 11/2009 | Chen |
| 2009/0283921 A1 | 11/2009 | Wang |
| 2009/0314743 A1 | 12/2009 | Ma |
| 2010/0040982 A1 | 2/2010 | Liu |
| 2010/0105205 A1 | 4/2010 | Lee |

\* cited by examiner

METHOD FOR FORMING DUAL DAMASCENE OPENING

FIELD OF THE INVENTION

The present invention relates to a method for manufacturing a semiconductor device, and more particularly to a method for forming a dual damascene opening of a semiconductor device.

BACKGROUND OF THE INVENTION

With the progress of the semiconductor process technology and the miniaturization of the microelectronic components, the density of semiconductor components on a single chip is gradually increased. Correspondingly, the spacing interval between every two adjacent semiconductor components is gradually decreased. Under this circumstance, the etching process for forming contact holes or dual damascene openings in a dielectric layer becomes more complicated.

For example, in a 45 nm generation semiconductor process, the pitch between every two adjacent contact holes could be smaller than a predetermined value, such as 155 nm, and the after development inspection critical dimension (ADICD) is about 70~80 nm. In accordance with the current single exposure patterning (SP) photolithography technology, it is impossible to produce a contact hole of about 70~80 nm diameter with a pitch smaller than 155 nm by a single exposure process. For solving the above drawbacks, a double patterning technology such as a litho-etch-litho-etch (LELE) process is employed to form a contact hole or a dual damascene opening.

A conventional litho-etch-litho-etch (LELE) process for forming the dual damascene opening will be illustrated in more details as follows. Firstly, a first hard mask layer with a trench pattern is formed on an inter-layer dielectric (ILD) layer. Then, a photoresist layer is filled into an opening of the trench pattern. Then, a second hard mask layer is formed on the photoresist layer. Then, two photo processes and two etching processes are performed to transfer via opening patterns to the second hard mask layer. By using the second hard mask layer as an etching mask, via openings are formed in the inter-layer dielectric layer. After the second hard mask layer is etched, another etching process is performed to form a trench opening. Meanwhile, the dual damascene opening is produced.

However, since the second hard mask layer is a silicon-containing hard mask bottom anti-reflection coating (SHB) layer, some drawbacks may occur. For example, during the process of transferring the photoresist pattern, the possibility of having resulting shrinkage of the critical dimension (CD) of the via opening pattern will be increased. Under this circumstance, the critical dimension of the overall dual damascene opening is possibly suffered from excessive variation. Furthermore, since the etching selectivity of the SHB layer is inferior to the inter-layer dielectric layer, the possibility of breaking through the inter-layer dielectric layer during the first etching process of forming the via opening is increased. Furthermore, during the process of removing the second hard mask layer, the particles generated by the photoresist layer and the SHB layer may result in contamination. Under this circumstance, the dielectric constant of the inter-layer dielectric layer exposed to the via opening is deteriorated.

Therefore, there is a need for providing an improved method of forming a dual damascene opening in order to obviate the drawbacks encountered from the prior art and increase the yield of the semiconductor device.

SUMMARY OF THE INVENTION

In accordance with an aspect, the present invention provides a method for forming a dual damascene opening. The method includes the following steps. Firstly, a first hard mask layer with a trench pattern is formed over a material layer. Then, a dielectric layer is formed over the first hard mask layer and filled into an opening of the trench pattern. Then, a second hard mask layer with a first via opening pattern is formed over the first hard mask layer and the dielectric layer, wherein the second hard mask layer is at least partially overlapped with the first hard mask layer. Then, a first etching process is performed by using the second hard mask layer as an etching mask, so that a via opening is at least formed in the dielectric layer.

In an embodiment, before the second hard mask layer is formed, the method further includes a step of flattening the dielectric layer, wherein the first hard mask layer is used as a stop layer.

In an embodiment, the dielectric layer is made of silicon oxynitride (SiON), silicon dioxide ($SiO_2$), or a composite material of silicon oxynitride and silicon dioxide.

In an embodiment, the step of flattening the dielectric layer is performed by a chemical mechanical polishing (CMP) process, a silicon nitride material removing process, a silicon dioxide material removing process, or a combination thereof.

In an embodiment, the step of forming the second hard mask layer includes sub-steps of forming a metal hard mask layer on the first hard mask layer and the dielectric layer, and etching the metal hard mask layer by using a composite photoresist layer as an etching mask, thereby forming the first via opening pattern.

In an embodiment, the composite photoresist layer includes a short wavelength photoresist layer and a long wavelength photoresist layer.

In an embodiment, the second hard mask layer is made of titanium nitride (TiN).

In an embodiment, in the step of removing the second hard mask layer, the second hard mask layer is removed by a chlorine ($Cl_2$) plasma etching process.

In an embodiment, the first hard mask layer is a multi-layered structure including a titanium nitride layer, a silicon dioxide layer and a silicon nitride layer.

In an embodiment, in the first etching process, the material layer is partially removed and the dielectric layer is removed by an etchant containing a fluorocarbon compound ($C_xF_y$).

In an embodiment, the material layer is made of a carbon-containing silicon compound.

In an embodiment, the etching selectivity ratio of the dielectric layer to the second hard mask layer with the fluorocarbon compound is substantially greater than 10.

In an embodiment, the fluorocarbon compound is octafluorocyclobutane ($C_4F_8$).

In an embodiment, the second hard mask layer is made of silicon dioxide, silicon nitride, silicon oxynitride, silicon carbide (SiC), or a combination thereof.

In an embodiment, the first via opening pattern is overlapped with the trench pattern.

In an embodiment, the second hard mask layer further includes a second via opening pattern, which is overlapped with the trench pattern.

In an embodiment, the formation of the second via opening pattern comprises steps of forming a patterned photo-resist layer on the second hard mask layer to fill an opening of the first via opening pattern; and etching the second hard mask layer by using the patterned photo-resist layer as an etching mask. In an embodiment, the patterned photo-resist layer comprises a bottom anti-reflection coating layer, an i-line photo-resist material layer and an ArF photo-resist material layer.

In an embodiment, after the via opening is formed, the method further comprises steps of removing the second hard mask layer and performing a second etching process by using the first hard mask layer as an etching mask, so that a trench opening is formed in the material layer and the via opening is further extended into the material layer, wherein the via opening is located within the trench opening.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As previously described, the conventional method for forming a dual damascene opening may result in excessive variation of the critical dimension and particle contamination. For solving the above drawbacks, the present invention provides an improved method for forming a dual damascene opening. The above and other objects, features and advantages of the present invention will become more readily apparent to those ordinarily skilled in the art after reviewing the following detailed description and accompanying drawings. An example of the present invention will be illustrated by referring to a method for fabricating a dual damascene opening 100.

FIGS. 1A~1G are schematic cross-sectional views illustrating a method of forming a dual damascene opening 100 in a material layer 104 according to an embodiment of the present invention.

Figure 1A:
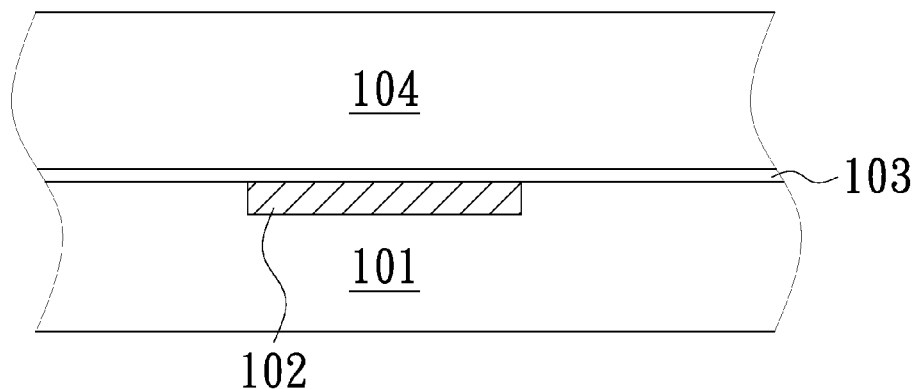
FIGS. 1A~1G are schematic cross-sectional views illustrating a method of forming a dual damascene opening in a material layer according to an embodiment of the present invention.
Figure 1B:
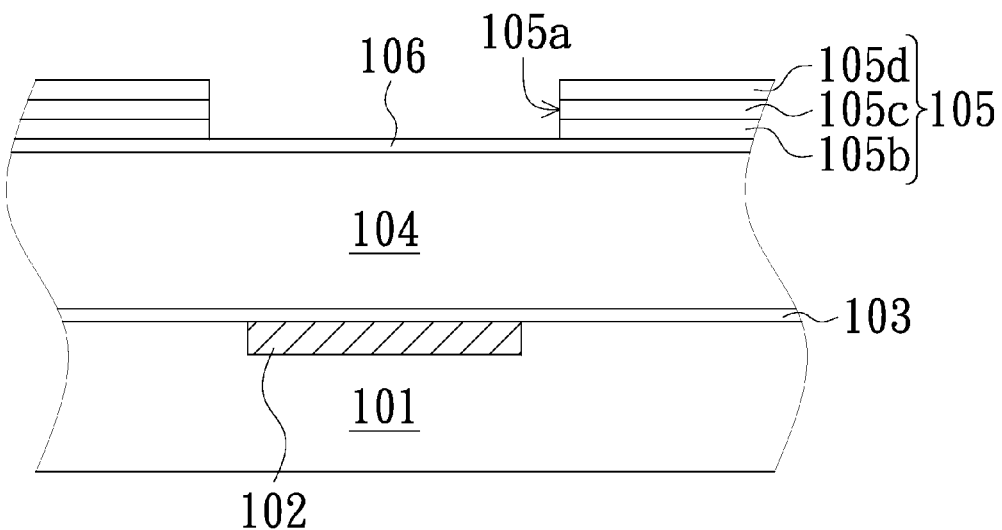
Figure 1C:
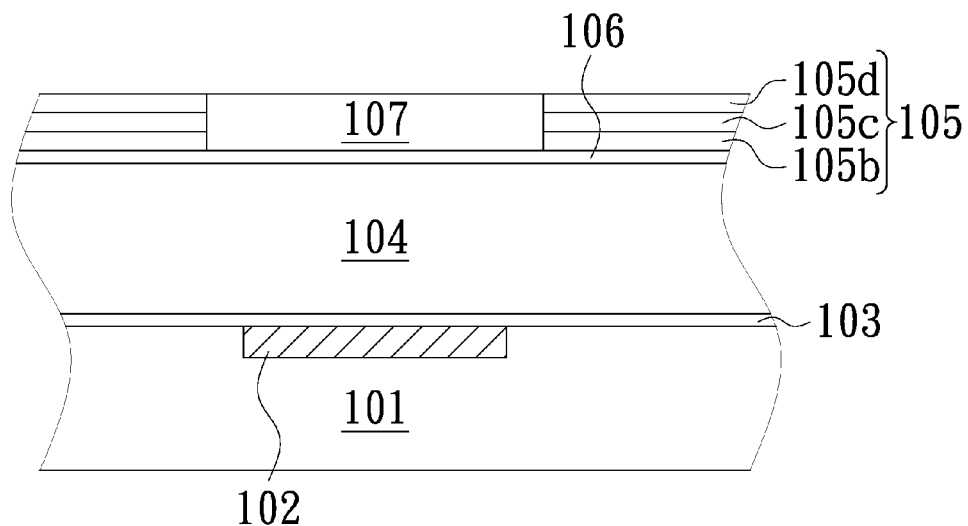

Please refer to FIG. 1A. A metal conductive layer 102 is formed on a substrate 101. A material layer 104 such as an inter metal dielectric (IMD) layer is formed over the substrate 101 to cover the metal conductive layer 102, and the dual damascene opening 100 subsequently formed in the IMD layer is used to form an interconnection structure penetrating through the IMD layer and electrically connecting metal conductive layers isolated by the IMD layer. However, it should be appreciated that materials and applications suitable for the material layer 104 and the method of forming the dual damascene opening may not be limited. Any materials allowing a dual damascene opening formed therein may be the suitable material of the material layer 104. For example, in some embodiments of the present invention, the material layer 104 may be an interlayer dielectric (ILD) layer which is formed on the substrate 101 having a source/drain and a gate, and the dual damascene opening 100 is subsequently formed in the ILD layer to form a contact penetrating through the ILD layer and electrically connecting to the silicide layer formed on the source/drain or the gate.

In some embodiments, the material layer 104 is made of an ultra low-dielectric constant material such as a porous organosilicate dielectric material or a carbon-containing silicon compound. In this embodiment, the material layer 104 is made of carbon-containing silicon compounds. Moreover, a cap layer 103 can be further disposed between the metal conductive layer 102 and the material layer 104. For example, the cap layer 103 is made of nitrogen-doped silicon carbide (SiCN). In some embodiments of the present invention, the cap layer 103 can be used as an etching stop layer to better control a subsequent etching process in a manner of preventing underneath metal lines from being damaged by the etching process.

The method of forming a dual damascene opening 100 in the material layer 104 will be illustrated as follows. Firstly, a hard mask layer 105 is formed on the material layer 104, and a trench pattern 105a is formed in the hard mask layer 105 (see FIG. 1B).

Please refer to FIG. 1B again. The hard mask layer 105 comprises a bottom layer 105b, a middle layer 105c and a top layer 105d, which are arranged in a stack configuration and sequentially formed over the material layer 104. The bottom layer 105b may be a metal hard mask layer made of titanium, titanium nitride or titanium/titanium nitride components; the top layer 105d is made of silicon nitride; and the middle layer 105c may comprise silicon nitride which can enhance the attachment of the top layer 105d and the bottom layer 105b. For increasing the compatibility between the hard mask layer 105 and the material layer 104, before the hard mask layer 105 is formed, a cap layer 106 can be formed on the material layer 104. The cap layer 106 comprising silicon nitride or silicon dioxide can protect the material layer 104 which is porous and has low dielectric constant from adverse effects imposed during the fabrication process. The trench pattern 105a is formed by performing a photolithography and etching process to partially remove the hard mask layer 105, wherein the cap layer 106 is used as an etch stop layer. Consequently, a part of the cap layer 106 is exposed to the outside through the trench pattern 105a.

Next, a deposition process such as a chemical vapor deposition (CVD) process or a spin-on coating process is performed to form a dielectric layer 107 on the hard mask layer 105 and fill the dielectric layer 107 into the opening of the trench pattern 105a. For example, the dielectric layer 107 is made of silicon oxynitride, silicon dioxide, or a combination thereof, by which the selectivity ratio of the dielectric layer 107 to the top layer 105d against the subsequent etching process can be remained at a relatively high level, and the material of the dielectric layer 107 can be more coordinate with the cap layer 106. Thus, the performance of the subsequent etching processes can be benefitted by the material selection of the dielectric layer 107.

Then, a flattening or planarization process is performed to remove a part of the dielectric layer 107, wherein the hard mask layer 105 is used as a stop layer. Consequently, the top surface of the flattened dielectric layer 107 is coplanar with the top surface of the hard mask layer 105 (see FIG. 1C). In some embodiments, for flattening the dielectric layer 107, an etch-back process is firstly performed to partially remove the dielectric layer 107, and then the remaining dielectric layer 107 is subject to a chemical mechanical polishing (CMP) process.

The etch-back process is performed by using an etchant containing a phosphoric acid to remove the silicon nitride material, and/or using an etchant containing a dilute hydrofluoric acid to remove the silicon dioxide material depending upon the material selection of the dielectric layer 107. In the chemical mechanical polishing (CMP) process, a high selectivity slurry (HSS) for silicon dioxide/silicon nitride is employed to polish the dielectric layer 107, wherein the hard mask layer 105 is a polishing stop layer.

It is noted that the etch-back process is optionally done to assist the chemical mechanical polishing (CMP) process. Alternatively, in some embodiments, only the chemical mechanical polishing (CMP) process is sufficient to allow the polished dielectric layer 107 to be coplanar with the hard mask layer 105. That is, in some embodiments, the etch-back process may be omitted.

Figure 1D:
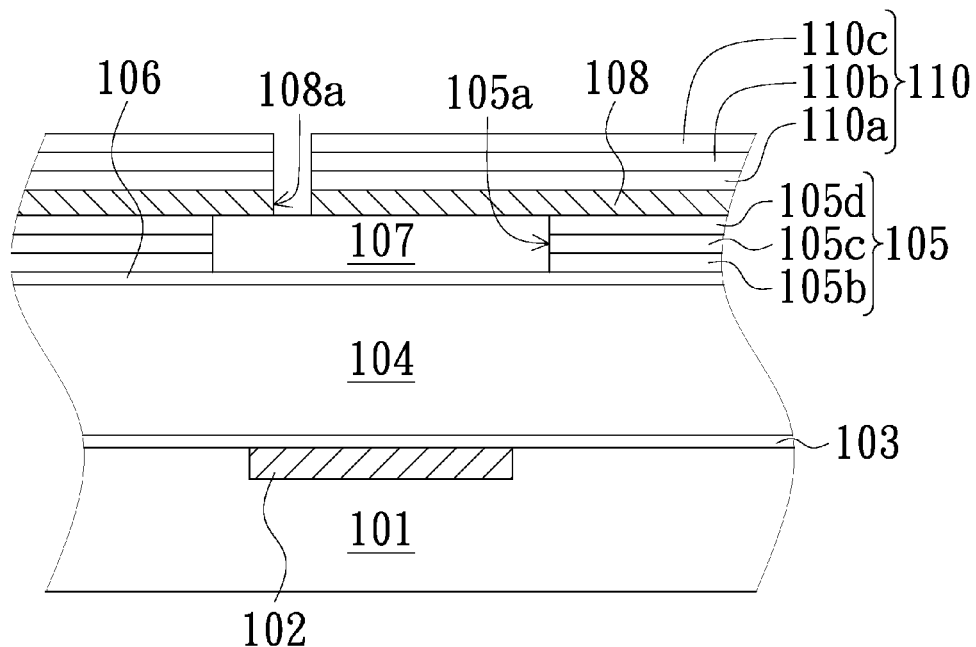
Figure 1E:
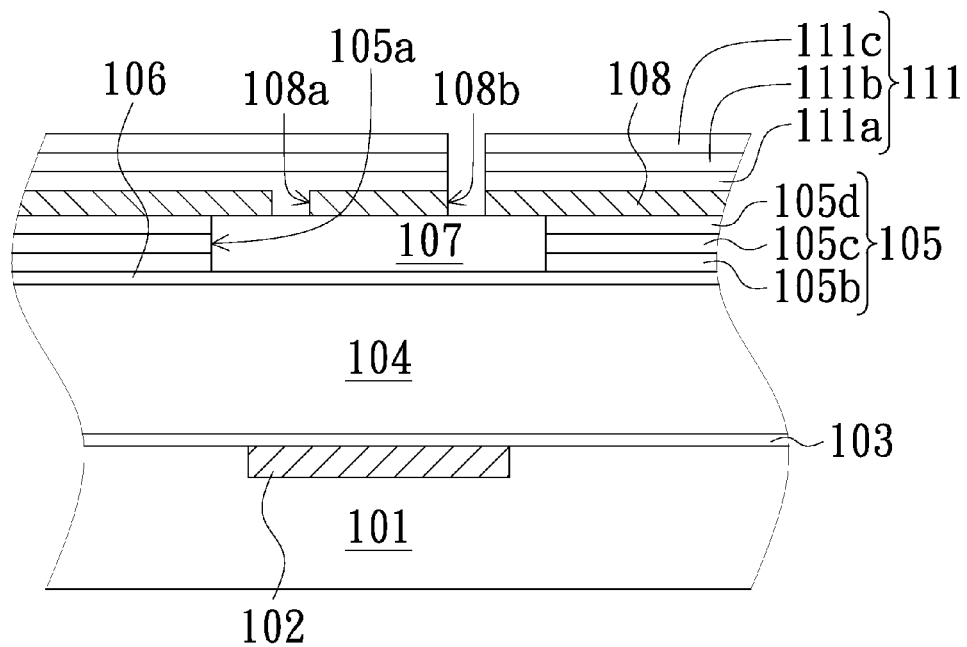
Figure 1F:
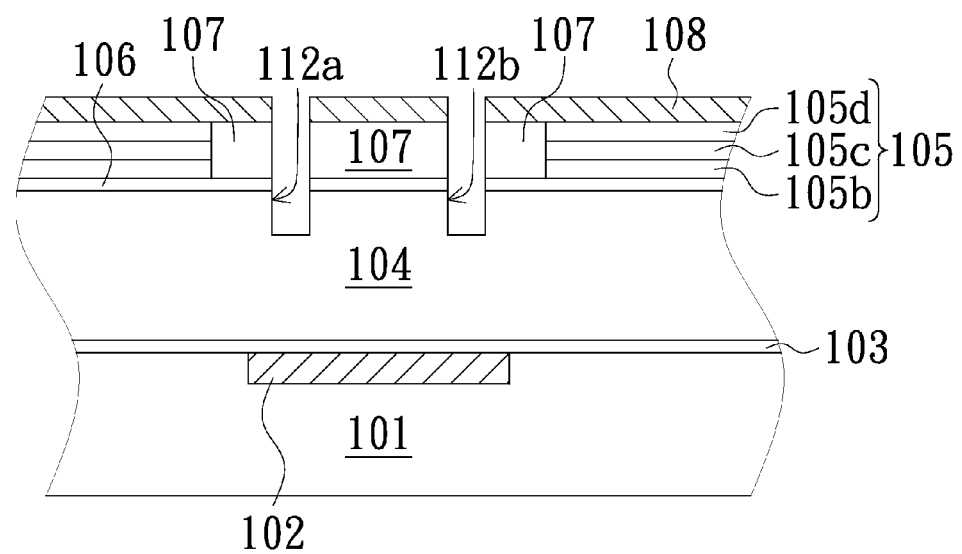

Next, please refer to FIG. 1D. After the polished dielectric layer 107 is flattened, another hard mask layer 108 is formed on the polished dielectric layer 107 and the hard mask layer 105. For example, the hard mask layer 108 is made of metal or metal nitride (e.g. titanium or titanium nitride). In some other embodiments, the hard mask layer 108 is made of silicon dioxide, silicon nitride, silicon oxynitride, silicon carbide (SiC), or a combination thereof.

The material of the hard mask layer 108 is selected according to the material of the dielectric layer 107 and the etching selectivity ratio of the hard mask layer 108 to the dielectric layer 107 in the subsequent etching processes. In general, the material selected for use in the hard mask layer 108 should have an etching rate lower than that of the dielectric layer 107 during the subsequent etching process for forming the via opening but have an etching rate greater than that of the dielectric layer 107 and the top layer 105d, in order to protect the dielectric layer 107 and the top layer 105d from being damaged while the hard mask layer 108 is removed by the subsequent chlorine plasma etching process.

For example, if the dielectric layer 107 is made of silicon dioxide, the hard mask layer 108 can be made of silicon oxynitride, silicon nitride, silicon carbide, titanium nitride, or a multi-layered structure thereof. Whereas, if the dielectric layer 107 is made of silicon oxynitride, the hard mask layer 108 can be made of silicon nitride, silicon carbide, titanium nitride, or a multi-layered structure thereof. In this embodiment, since the dielectric layer 107 is made of silicon oxynitride, the hard mask layer 108 is made of titanium nitride.

Next, the hard mask layer 108 is patterned to form at least one via opening pattern 108a in the hard mask layer 108. The via opening pattern 108a is overlapped with the trench pattern 105a of the hard mask layer 105. A method for patterning the hard mask layer 108 comprises the following steps. Firstly, a patterned photoresist layer 110 is formed on the hard mask layer 108. Then, an etching process is performed to remove a part of the hard mask layer 108, so that the pattern of the patterned photoresist layer 110 is transferred to the hard mask layer 108. In this embodiment, the photoresist layer 110 is a multi-layered structure including a bottom anti-reflection coating layer 110a, an i-line photoresist material layer 110b reactive to 365-nm wavelength light and an ArF photoresist material layer 110c reactive to 193-nm wavelength light (see FIG. 1D).

Next, another photolithography and etching process is performed to form another via opening pattern 108b. The method for forming the via opening pattern 108b is similar to the method for forming the via opening pattern 108a. After the patterned photoresist layer 110 is removed, a patterned photoresist layer 111 including a bottom anti-reflection coating layer 111a, an i-line photoresist material layer 111b and an ArF photoresist material layer 111c is formed on the hard mask layer 108 and filled into the opening of the via opening pattern 108a. Then, an etching process is performed to form another via opening pattern 108b in the hard mask layer 108. The via opening pattern 108b is overlapped with the trench pattern 105a of the hard mask layer 105 (see FIG. 1E).

After the patterned photoresist layer 111 is removed, an etching process is performed to partially remove the dielectric layer 107 and the material layer 104 by using the patterned hard mask layer 108 as the etching mask. In some embodiments, an etchant containing a fluorocarbon compound $(C_xF_y)$ with a high carbon ratio such as $C_4F_8$ or perfluorocyclopentene $(C_5F_8)$ can be used to partially remove the dielectric layer 107 and the material layer 104. In some other embodiments, an etchant containing tetrafluoromethane $(CF_4)$ is used to partially remove the dielectric layer 107 and the material layer 104, wherein the etching selectivity ratio of the dielectric layer 107 to the hard mask layer 108 with the etchant containing $CF_4$ is substantially equal to 1. In this embodiment, an etchant containing $C_4F_8$ is employed in the etching process because the etching selectivity ratio of the dielectric layer 107 to the hard mask layer 108 with the etchant is substantially greater than 10. Consequently, two via openings 112a and 112b are at least extended into the dielectric layer 107. In this embodiment, these via openings 112a and 112b are extended through the dielectric layer 107 and into the material layer 104 without breaking through the material layer 104 (see FIG. 1F).

Figure 1G:
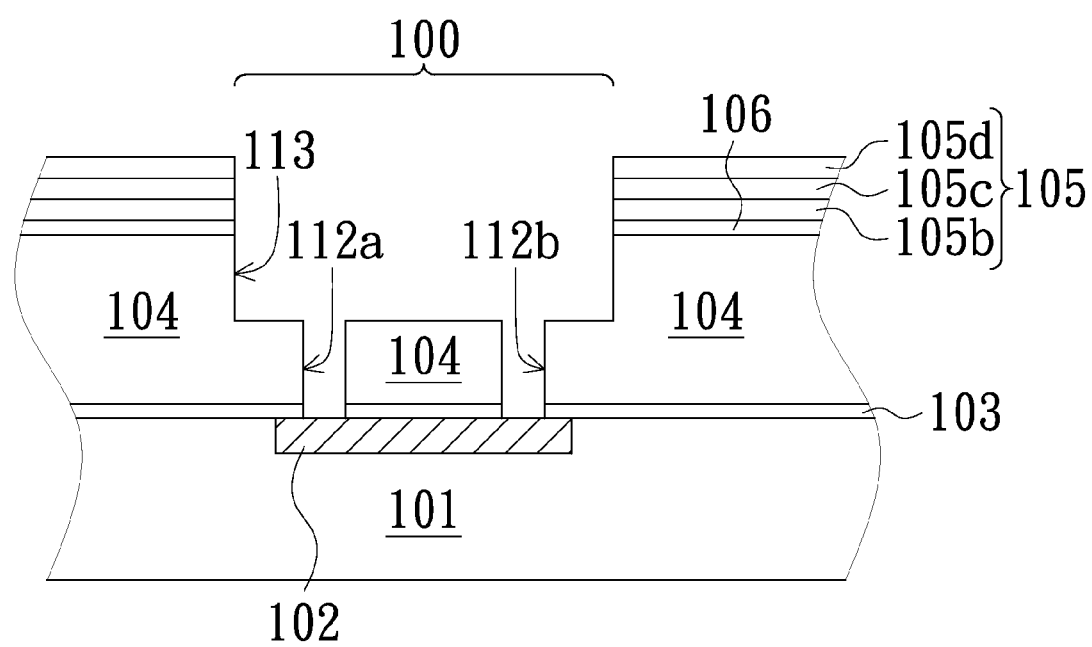

Next, the hard mask layer 108 is removed by a chlorine plasma etching process. Then, by using the hard mask layer 105 as the etching mask, another etching process is performed to remove the dielectric layer 107 and partially remove the material layer 104. In this embodiment, the etchant containing $C_4F_8$ is employed in the etching process to remove the dielectric layer 107 and partially remove the material layer 104. Consequently, a trench opening 113 is formed in the material layer 104, and these via openings 112a and 112b are further extended into the material layer 104. These via openings 112a and 112b are disposed within the trench opening 113 while breaking through the material layer 104 and the cap layer 103. Meanwhile, the metal conductive layer 102 is exposed to the outside through these via openings 112a and 112b. The resulting structure of the dual damascene opening 100 is shown in FIG. 1G. Afterwards, a metallic material is filled into the dual damascene opening 100 to form a dual damascene interconnect structure (not shown).

Figure 2F:
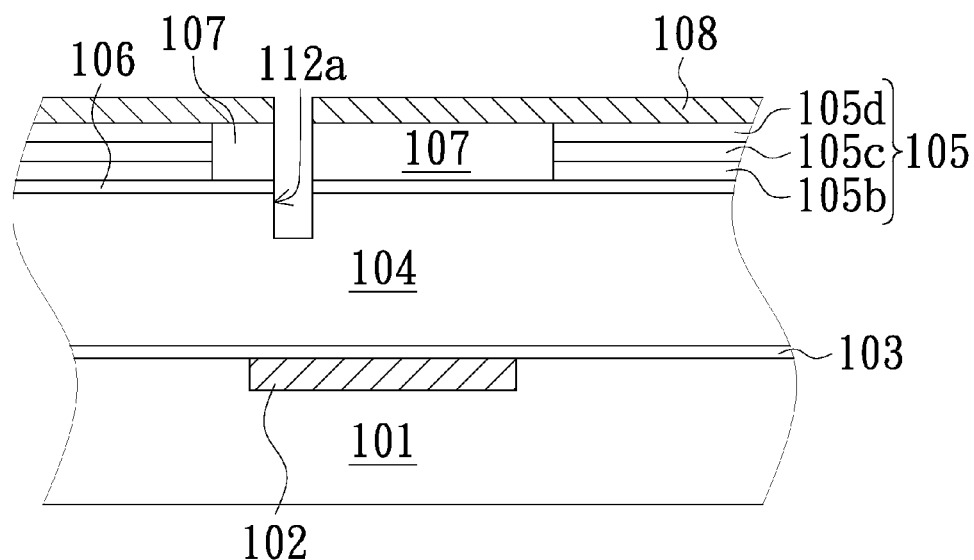
FIGS. 2F and 2G are schematic cross-sectional views illustrating portions of a method of forming a dual damascene opening in a material layer according to another embodiment of the present invention.
Figure 2G:
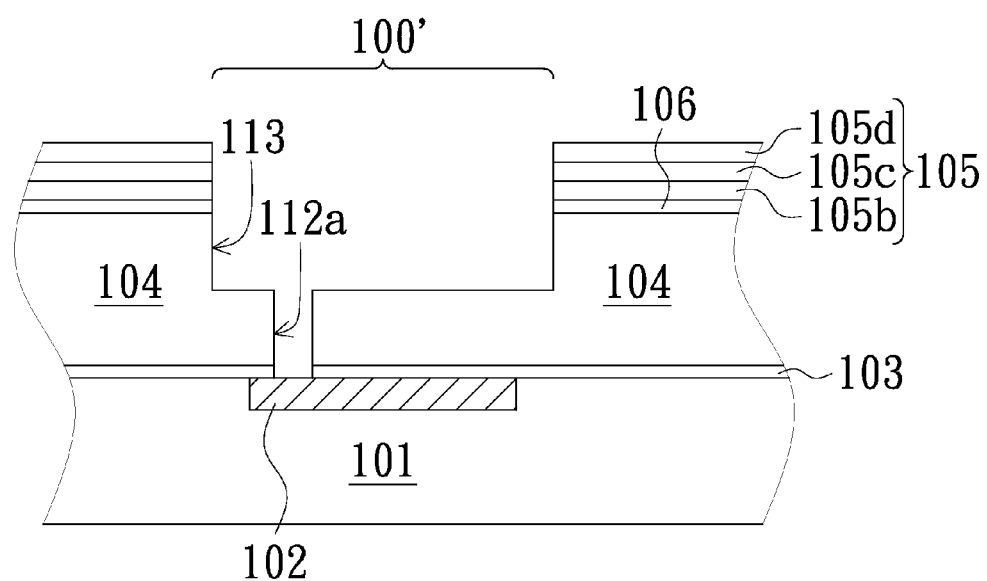

It should be appreciated that although merely a LELE process for forming the dual damascene opening is described in the aforementioned embodiments, the application scope of the present method is not limited thereto and is also applicable to a single litho-etch process for forming a dual damascene opening. For example, in some embodiments of the present invention, after the via opening pattern 108a is formed in the hard mask layer 108 (see FIG. 1D) an etching process by using the patterned hard mask layer 108 as the etching mask is performed to partially remove the dielectric layer 107 and the material layer 104 (see FIG. 2F), instead of further forming another via openings pattern 108b; and then another etching process is performed by using the hard mask layer 105 as the etching mask after the patterned hard mask layer 108 is removed, whereby a dual damascene opening 100' having a single via opening 112a is formed (see FIG. 2G).

From the above description, the present invention provides a method for forming a dual damascene opening. In accordance with the present invention, the dielectric layer is filled into the opening of the trench pattern of the first hard mask layer in replacing of the conventional photoresist layer. Moreover, with respect to the inter-layer dielectric layer, the hard mask layer with a higher etching selectivity is used to replace the SHB layer. Consequently, the second hard mask layer with the via opening pattern is formed over the first hard mask layer. Next, by using the first hard mask layer and the second hard mask layer as the etching masks, the inter-layer dielectric layer underlying the first hard mask layer are subjected to at least two etching processes. In such way, a dual damascene opening is formed in the inter-layer dielectric layer.

Moreover, since the dielectric layer and the second hard mask layer are neither the photoresist layer nor the SHB layer, the problem of excessive shrinkage of the critical dimension (CD) found during the photoresist pattern transferring process will be avoided. Moreover, since the hard mask layer has an anti-etch capability superior to the SHB layer, the possibility of breaking through the inter-layer dielectric layer is minimized during the first etching process. Consequently, the critical dimension (CD) variation of the overall dual damascene opening is effectively reduced. Furthermore, during the process of removing the second hard mask layer, the problem of generating the particles from the photoresist layer and the SHB layer to result in contamination will be avoided. Under this circumstance, the yield of the semiconductor device in the subsequent processes will be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a dual damascene opening, the method comprising steps of:
    forming a first hard mask layer with a trench pattern over a material layer;
    forming a dielectric layer over the first hard mask layer and filling the dielectric layer into an opening of the trench pattern;
    forming a second hard mask layer with a first via opening pattern over the first hard mask layer and the dielectric layer, so as to make the second hard mask layer at least partially overlapped with the first hard mask layer;
    performing a first etching process with an etchant containing a fluorocarbon compound ($C_xF_y$) by using the second hard mask layer as an etching mask, so that a via opening is at least formed in the dielectric layer, wherein the second hard mask layer has an etching rate by the etchant lower than that of the dielectric layer;
    removing the second hard mask layer by a chlorine ($Cl_2$) plasma etching process, wherein the second hard mask layer has an etching rate in the $Cl_2$ plasma etching process greater than that of the dielectric layer; and
    performing a second etching process by using the first hard mask layer as an etching mask, so that a trench opening is formed in the material layer and the via opening is further extended into the material layer, wherein the via opening is located within the trench opening.

2. The method according to claim 1, wherein before the second hard mask layer is formed, the method further comprises a step of flattening the dielectric layer by using the first hard mask layer as a stop layer.

3. The method according to claim 2, wherein the step of flattening the dielectric layer is performed by a chemical mechanical polishing (CMP) process, a silicon nitride material removing process, a silicon dioxide material removing process, or a combination thereof.

4. The method according to claim 1, wherein the dielectric layer is made of silicon oxynitride (SiON), silicon dioxide ($SiO_2$), or a composite material of silicon oxynitride and silicon dioxide.

5. The method according to claim 1, wherein the step of forming the second hard mask layer comprises:
    forming a metal hard mask layer on the first hard mask layer and the dielectric layer; and
    etching the metal hard mask layer by using a composite photoresist layer as an etching mask, thereby forming the first via opening pattern.

6. The method according to claim 5, wherein the composite photoresist layer comprises a short wavelength photoresist layer and a long wavelength photoresist layer.

7. The method according to claim 1, wherein the second hard mask layer is made of titanium nitride (TiN).

8. The method according to claim 7, wherein the first hard mask layer is a multi-layered structure including a titanium nitride layer, a silicon dioxide layer and a silicon nitride layer.

9. The method according to claim 8, wherein in the first etching process, the material layer is partially removed and the dielectric layer is removed by an etchant containing a fluorocarbon compound ($C_xF_y$).

10. The method according to claim 9, wherein the material layer is made of a carbon-containing silicon compound.

11. The method according to claim 10, wherein the etching selectivity ratio of the dielectric layer to the second hard mask layer with the fluorocarbon compound is substantially greater than 10.

12. The method according to claim 11, wherein the fluorocarbon compound is octafluorocyclobutane ($C_4F_8$).

13. The method according to claim 1, wherein the second hard mask layer is made of silicon dioxide, silicon nitride, silicon oxynitride, silicon carbide (SiC), or a combination thereof.

14. The method according to claim 1, wherein the first via opening pattern is overlapped with the trench pattern.

15. The method according to claim 14, wherein the second hard mask layer further comprises a second via opening pattern, which is overlapped with the trench pattern.

16. The method according to claim 15, wherein the formation of the second via opening pattern comprises steps of:
    forming a patterned photo-resist layer on the second hard mask layer to fill an opening of the first via opening pattern; and
    etching the second hard mask layer by using the patterned photo-resist layer as an etching mask.

17. The method according to claim 16, wherein the patterned photo-resist layer comprises a bottom anti-reflection coating layer, an i-line photo-resist material layer and an ArF photo-resist material layer.

18. The method according to claim 1, wherein in the second etching process, the material layer is partially removed and the dielectric layer is removed by an etchant containing a fluorocarbon compound ($C_xF_y$).

* * * * *